(12) United States Patent
Takahashi

(10) Patent No.: US 12,387,966 B2
(45) Date of Patent: Aug. 12, 2025

(54) WAFER CHUCK, TEMPERATURE CONTROL SYSTEM, AND TEMPERATURE CONTROL METHOD

(71) Applicant: Tokyo Seimitsu Co., Ltd., Tokyo (JP)

(72) Inventor: Takenori Takahashi, Tokyo (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 18/916,974

(22) Filed: Oct. 16, 2024

(65) Prior Publication Data

US 2025/0038035 A1 Jan. 30, 2025

Related U.S. Application Data

(63) Continuation of application No. PCT/JP2023/020224, filed on May 31, 2023.

(30) Foreign Application Priority Data

Feb. 7, 2023 (JP) .................................. 2023-016938
May 2, 2023 (JP) .................................. 2023-076050

(51) Int. Cl.
*H01L 21/683* (2006.01)
*H01L 21/67* (2006.01)

(52) U.S. Cl.
CPC .... *H01L 21/6833* (2013.01); *H01L 21/67248* (2013.01)

(58) Field of Classification Search
CPC ........... H01L 21/6833; H01L 21/67098; H01L 21/67103; H01L 21/67109;
(Continued)

(56) References Cited

U.S. PATENT DOCUMENTS

2002/0062954 A1 5/2002 Getchel et al.
2002/0068371 A1 6/2002 Yun
(Continued)

FOREIGN PATENT DOCUMENTS

CN 101527274 A 9/2009
JP 60-213834 A 10/1985
(Continued)

OTHER PUBLICATIONS

International Search Report for PCT/JP2023/020224 (PCT/ISA/210) mailed on Aug. 22, 2023.
(Continued)

*Primary Examiner* — Sang Y Paik
(74) *Attorney, Agent, or Firm* — Birch, Stewart, Kolasch & Birch, LLP

(57) ABSTRACT

A wafer chuck having a holding surface for holding a wafer, the wafer chuck includes: a heating and cooling unit configured to heat or cool the wafer chuck; at least one temperature sensor disposed in the wafer chuck; and a heat flow sensor which is disposed in the wafer chuck, and in which a plurality of thermocouples are connected in series and connecting parts between thermocouples adjacent to each other are alternately disposed at a first depth position from the holding surface and at a second depth position deeper than the first depth position. The heat flow sensor has a plurality of temperature measurement points provided for the respective thermocouples, and the plurality of temperature measurement points are disposed over an entirety of the wafer chuck when the wafer chuck is seen in plan view.

11 Claims, 11 Drawing Sheets

(58) Field of Classification Search
CPC ......... H01L 21/67115; H01L 21/67242; H01L 21/67248; H05B 3/68; H05B 3/74
USPC ...................................................... 219/444.1
See application file for complete search history.

(56) References Cited

U.S. PATENT DOCUMENTS

| | | | |
|---|---|---|---|
| 2008/0136436 | A1 | 6/2008 | Hong |
| 2009/0219969 | A1 | 9/2009 | Yamamoto |
| 2022/0262660 | A1* | 8/2022 | Omuro ............... H01L 21/67248 |
| 2022/0381622 | A1* | 12/2022 | Nurnus .................. G01K 7/16 |

FOREIGN PATENT DOCUMENTS

| | | | |
|---|---|---|---|
| JP | 62-96831 | A | 5/1987 |
| JP | 3-196206 | A | 8/1991 |
| JP | 2002-170775 | A | 6/2002 |
| JP | 2005-337750 | A | 12/2005 |
| JP | 2005-340291 | A | 12/2005 |
| JP | 2006-294873 | A | 10/2006 |
| JP | 2009-212199 | A | 9/2009 |
| JP | 2016-29382 | A | 3/2016 |
| JP | 2017-53677 | A | 3/2017 |
| JP | 2019-66286 | A | 4/2019 |

OTHER PUBLICATIONS

Notice of Reasons for Refusal in Japanese patent application No. 2023-016938 dated Mar. 16, 2023.
Written Opinion of the International Searching Authority for PCT/JP2023/020224 (PCT/ISA/237) mailed on Aug. 22, 2023.
Korean Office Action for Korean Application No. 10-2024-7034103, dated Nov. 18, 2024, with English translation.
Taiwanese Office Action and Search Report for Taiwanese Application No. 112121555, dated Jan. 17, 2025, with English translation.
Chinese Office Action and Search Report for Chinese Application No. 202380033727.7, dated May 13, 2025, with English translation.
Extended European Search Report issued Jul. 11, 2025 in corresponding EP 23921233.5.

* cited by examiner

WAFER CHUCK, TEMPERATURE CONTROL SYSTEM, AND TEMPERATURE CONTROL METHOD

CROSS-REFERENCE TO RELATED APPLICATIONS

The present application is a Continuation of PCT International Application No. PCT/JP2023/020224 filed on May 31, 2023 claiming priorities under 35 U.S.C § 119(a) to Japanese Patent Application No. 2023-016938 filed on Feb. 7, 2023 and Japanese Patent Application No. 2023-076050 filed on May 2, 2023. Each of the above applications is hereby expressly incorporated by reference, in its entirety, into the present application.

BACKGROUND OF THE INVENTION

Field of the Invention

The present invention relates to a wafer chuck, a temperature control system, and a temperature control method.

Description of the Related Art

In a semiconductor manufacturing process, various treatments are applied to a semiconductor wafer to form chips (dice) each including a semiconductor device. The electrical properties of each chip are tested, and then chips are individually divided (diced) by a dicer. Subsequently, each chip is fixed to a lead frame or the like, and is assembled. The electrical properties are tested by a wafer test system that includes a prober and a tester. The prober fixes the wafer on the wafer chuck, and brings a probe into contact with an electrode pad of each chip. The tester provides power supply and various test signals through terminals connected to the probe, analyzes a signal output from the electrode of the chip, and verifies whether a semiconductor device on the chip, which is a test target, normally operates or not.

The prober is required to bring the temperature during testing of the electrical properties to a set temperature, and maintain the temperature constant. Accordingly, to cope with heat generation of the semiconductor device (device to be measured, measurement target device) of a chip to be tested, temperature sensors, such as resistance temperature detectors or thermocouple-type temperature sensors, are installed in a wafer chuck to detect the temperature and the amount of heat generation, and temperature of the wafer chuck is controlled based on the detection results of the temperature sensors.

For example, according to a prober disclosed in Patent Literature 1, temperature sensors are arranged in a wafer chuck (prober chuck), and temperature of the wafer chuck is controlled based on a detection result of a temperature sensor closest to the measurement target device to be tested among the temperature sensors.

CITATION LIST

Patent Literature(s)

Patent Literature 1: Japanese Patent Application Laid-Open No. 2006-294873

SUMMARY OF THE INVENTION

In the prober disclosed in Patent Literature 1, to correctly measure the temperature of the wafer chuck that corresponds to a heat generating part of the device to be measured, it is required to increase the number of temperature sensors installed in the wafer chuck. However, due to a structural limitation in the wafer chuck, the number of installations and the installation positions are limited, and it is difficult to embed a large number of temperature sensors at ideal positions. In the case where a large number of temperature sensors are installed, the number of required sets of signal lines of the temperature sensors increases as increase in the number of temperature sensors, and it is significantly difficult to lay out their wiring.

In particular, in a case where the device to be measured is a an SoC (System On Chip) type device, such as a CPU (Central Processing Unit), a GPU (Graphics Processing Unit), or an APU (Accelerated Processing Unit), its heat generation has a locally high heat density in comparison with a memory device. Accordingly, in a case where many temperature sensors cannot be installed in the wafer chuck, it is difficult to appropriately control the temperature of the wafer chuck to cope with heat generation of the device to be measured.

The present invention has been made in view of such situations, and aims to provide a wafer chuck that can measure temperature of the wafer chuck corresponding to a heat generating part of a wafer without increasing the number of installed temperature sensors, and a temperature control system and a temperature control method that can appropriately control the temperature of the wafer chuck.

A wafer chuck to achieve the object of the present invention is a wafer chuck having a holding surface for holding a wafer, the wafer chuck including: a heating and cooling unit configured to heat or cool the wafer chuck; at least one temperature sensor disposed in the wafer chuck; and a heat flow sensor which is disposed in the wafer chuck, and in which a plurality of thermocouples are connected in series and connecting parts between thermocouples adjacent to each other are alternately disposed at a first depth position from the holding surface and at a second depth position deeper than the first depth position, wherein the heat flow sensor has a plurality of temperature measurement points provided for the respective thermocouples, and the plurality of temperature measurement points are disposed over an entirety of the wafer chuck when the wafer chuck is seen in plan view.

According to this wafer chuck, the temperature of the wafer chuck corresponding to the heat generating part of the wafer may be measured without increasing the number of installed temperature sensors.

In the wafer chuck according to another aspect of the present invention, temperature sensors are disposed in a distributed manner. Accordingly, when the device to be measured on the wafer to be tested generates heat, the temperature of the wafer chuck at a part that is not affected by the heat generation may be detected by at least one of the temperature sensors.

A temperature control system to achieve the object of the present invention includes: the above-described wafer chuck; and a temperature control unit configured to calculate a control temperature, based on a detection result of the temperature sensor and on a detection result of the heat flow sensor.

According to the temperature control system, the temperature of the wafer chuck may be appropriately controlled without increasing the number of temperature sensors arranged in the wafer chuck.

In the temperature control system according to another aspect of the present invention, the temperature control unit executes: a process of detecting, based on the detection result of the temperature sensor, a reference temperature that is a temperature at the second depth position in a corresponding part being a part corresponding to a heat generating part of the wafer on the wafer chuck; a process of calculating a vertical temperature difference between the first depth position and the second depth position in the corresponding part, based on the detection result of the heat flow sensor; and a process of calculating, as the control temperature, a temperature of a heat generating part temperature measurement point that is a temperature of the corresponding part, based on the reference temperature and the vertical temperature difference. Accordingly, the temperature of the wafer chuck may be appropriately controlled without increasing the number of temperature sensors arranged in the wafer chuck.

In the temperature control system according to another aspect of the present invention, the temperature control unit executes: a process of detecting, based on the detection result of the temperature sensor, a reference temperature that is a temperature at the second depth position in a corresponding part being a part corresponding to a heat generating part of the wafer on the wafer chuck; a process of calculating a vertical temperature difference between the first depth position and the second depth position in the corresponding part, based on the detection result of the heat flow sensor; and a process of calculating, as the control temperature, a device temperature that is a temperature of a heat generating part of the wafer, based on the reference temperature, on the vertical temperature difference, and on data that includes physical property values and dimensions of the wafer and the wafer chuck. Accordingly, the temperature of the wafer chuck may be appropriately controlled without increasing the number of temperature sensors arranged in the wafer chuck.

In the temperature control system according to another aspect of the present invention, in the wafer chuck, the plurality of temperature sensors are disposed in a distributed manner, and the temperature control unit detects, as the reference temperature, a lowest temperature among temperatures detected by the plurality of temperature sensors, or an average or a median of the temperatures detected by the plurality of temperature sensors.

In the temperature control system according to another aspect of the present invention, the temperature control unit controls the heating and cooling unit so that the control temperature may be equal to a preset target temperature.

A temperature control method to achieve the object of the present invention is a temperature control method of controlling a temperature of the wafer chuck described above, the method including: a reference temperature detecting step of detecting, by the at least one temperature sensor, a reference temperature of the wafer chuck; a heat flow detecting step of detecting, by the heat flow sensor, a heat flow caused by partial heat generation of the wafer held on the holding surface; and a temperature control step of calculating a control temperature, based on a detection result of the temperature sensor and on a detection result of the heat flow sensor.

In the temperature control method according to another aspect of the present invention, the reference temperature detecting step detects, as the reference temperature, a temperature at the second depth position in a corresponding part that corresponds to a heat generating part of the wafer on the wafer chuck, and the temperature control step includes: a process of calculating a vertical temperature difference between the first depth position and the second depth position in the corresponding part, based on the detection result of the heat flow detecting step; and a process of calculating, as the control temperature, a temperature of a heat generating part temperature measurement point that is a temperature of the corresponding part, based on the reference temperature and the vertical temperature difference.

In the temperature control method according to another aspect of the present invention, the reference temperature detecting step detects, as the reference temperature, a temperature at the second depth position in a corresponding part that corresponds to a heat generating part of the wafer on the wafer chuck, and the temperature control step includes: a process of calculating a vertical temperature difference between the first depth position and the second depth position in the corresponding part, based on the detection result of the heat flow detecting step; and a process of calculating, as the control temperature, a device temperature that is a temperature of a heat generating part of the wafer, based on the reference temperature, on the vertical temperature difference, and on data that includes physical property values and dimensions of the wafer and the wafer chuck.

In the temperature control method according to another aspect of the present invention, the temperature control step includes a process of heating or cooling the wafer chuck so that the control temperature may be a preset target temperature.

According to the present invention, the temperature of the wafer chuck corresponding to the heat generating part of the wafer can be measured without increasing the number of installed temperature sensors. The temperature of the wafer chuck can be appropriately controlled.

DESCRIPTION OF THE EMBODIMENTS

Hereinafter, a preferable embodiment of the present invention is described with reference to the accompanying drawings.

<Wafer Test System>

Figure 1:
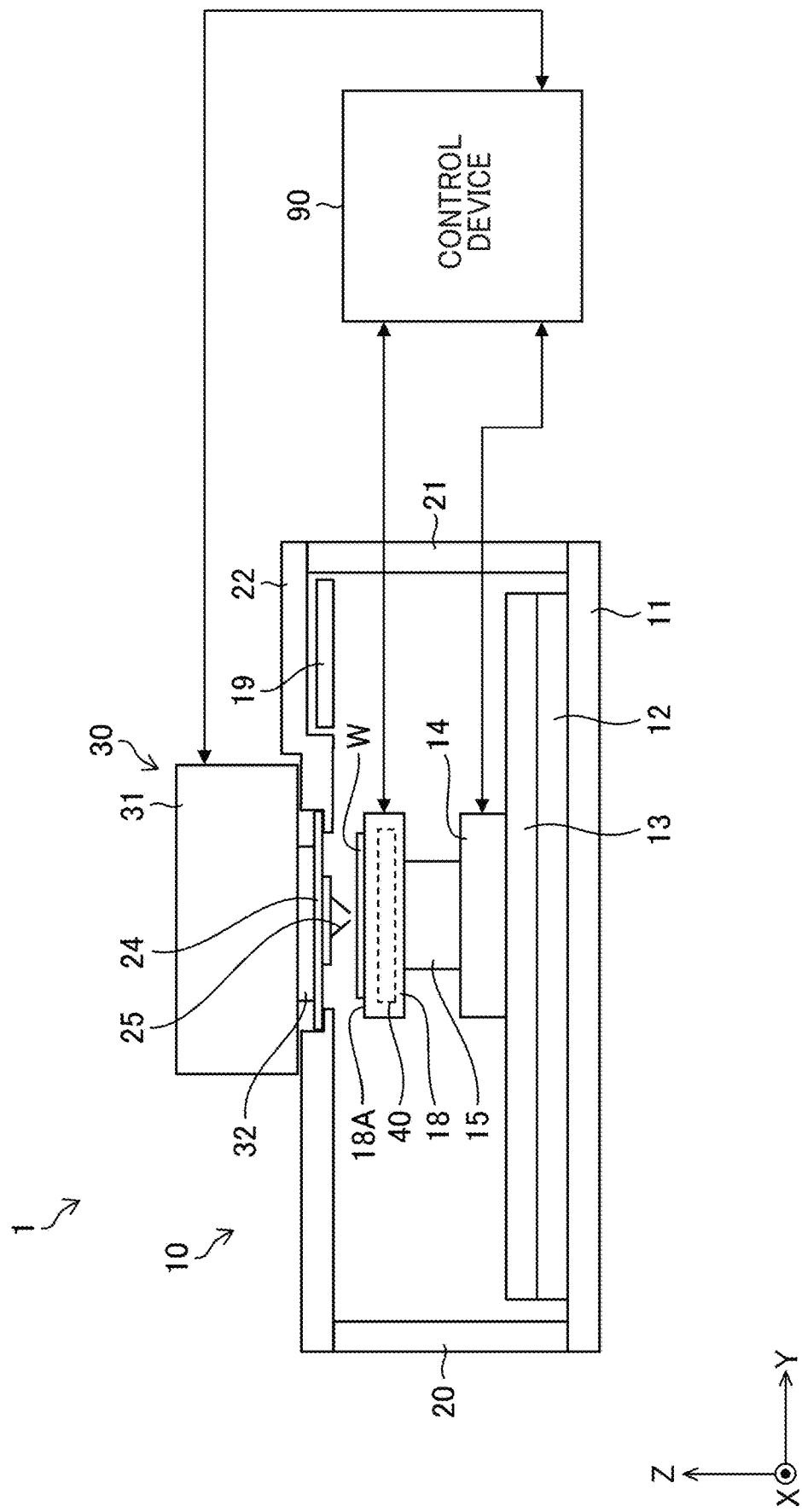
FIG. 1 is a schematic diagram showing an entire configuration of a wafer test system.

FIG. 1 is a schematic diagram showing the entire configuration of a wafer test system 1. Note that description is hereinafter made using an XYZ orthogonal coordinate system where a plane in parallel with the wafer chuck 18 is adopted as an XY plane.

The wafer test system 1 shown in FIG. 1 includes: a prober 10 that brings a probe 25 into contact with an electrode on each chip on a wafer W; and a tester 30 that is electrically connected to the probe 25, applies current and voltage to each chip for an electric test, and measures properties.

The prober 10 includes: a base stage 11; a movable base 12 provided on the base stage 11; a Y-axis movable stage 13; an X-axis movable stage 14; a Z-axis movable rotating unit 15; a wafer chuck 18; a wafer alignment camera 19; pillars 20 and 21; a head stage 22; and a probe card 24 attached to the head stage 22.

The probe card 24 is provided with the probe 25. Note that a needle positioning camera that detects the position of the probe 25, a cleaning mechanism that cleans the probe, and the like are provided. However, their illustration is omitted here.

The movable base 12, the Y-axis movable stage 13, the X-axis movable stage 14, and the Z-axis movable rotating unit 15 constitute a moving and rotating mechanism that moves the wafer chuck 18 in three-axis directions, and rotates around the Z-axis. Since the moving and rotating mechanism is widely known, description thereof is omitted here.

The wafer chuck 18 holds the wafer W on which chips are formed, by vacuum suction. A holding surface 18A for holding the wafer W is provided on the upper surface of the wafer chuck 18.

In the wafer chuck 18, a heating and cooling unit 40 as a heating and cooling source is provided so as to perform electrical property tests for chips in a high-temperature state (e.g., 150° C. at the highest) or a low-temperature state (e.g., −40° C. at the lowest). The heating and cooling unit 40 heats or cools the wafer chuck 18. An appropriate heater or cooler may be applied as the heating and cooling unit 40. As the heating and cooling unit 40, various units may be applied that include, for example, a combination of a heater and a cooling plate, a combination of Peltier element and a cooling plate, a double-layer structure having a heating layer made up of a planar heater and a cooling layer provided with a path for a cooling fluid, and a single layer structure of a thermal conductor with an embedded cooling tube around which a heater is wound. The heating and cooling unit 40 is an example of a heating and cooling unit in the present invention.

The wafer chuck 18 is attached on the Z-axis movable rotating unit 15. The wafer chuck 18 is movable in the three-axis directions (X-, Y-, and Z-axis directions) by the moving and rotating mechanism described above, and is rotatable in a rotation direction (θ direction) around the Z-axis.

The probe card 24 is disposed above the wafer chuck 18 on which the wafer W is held. The probe card 24 is detachably attached to an opening (probe card attachment part) of the head stage 22 constituting a top board of a casing of the prober 10.

The probe card 24 includes the probe 25 disposed in conformity with electrode arrangement on the chip to be tested, and is replaced depending on the chip to be tested.

The tester 30 includes a tester main body 31, and a contact ring 32 provided to the tester main body 31. The probe card 24 includes electrodes connected to the respective probes 25. The contact ring 32 includes spring probes disposed so as to contact the respective electrodes. The tester main body 31 is held to face the prober 10 by a support mechanism, not shown.

A control device 90 achieves a function by executing a control program, and controls the operation of the entire prober 10. For example, the control device 90 controls movement of the aforementioned moving and rotating mechanism (the movable base 12, the Y-axis movable stage 13, the X-axis movable stage 14, and the Z-axis movable rotating unit 15). The control device 90 controls the operations of the tester 30 and the heating and cooling unit 40. Note that the control device 90 includes an after-mentioned temperature control device 100 (see FIG. 2).

<Temperature Control System>

Next, a temperature control system incorporated in the prober 10 in this embodiment is described. Note that the temperature control system is an example of a temperature control system in the present invention.

First Embodiment

Figure 2:
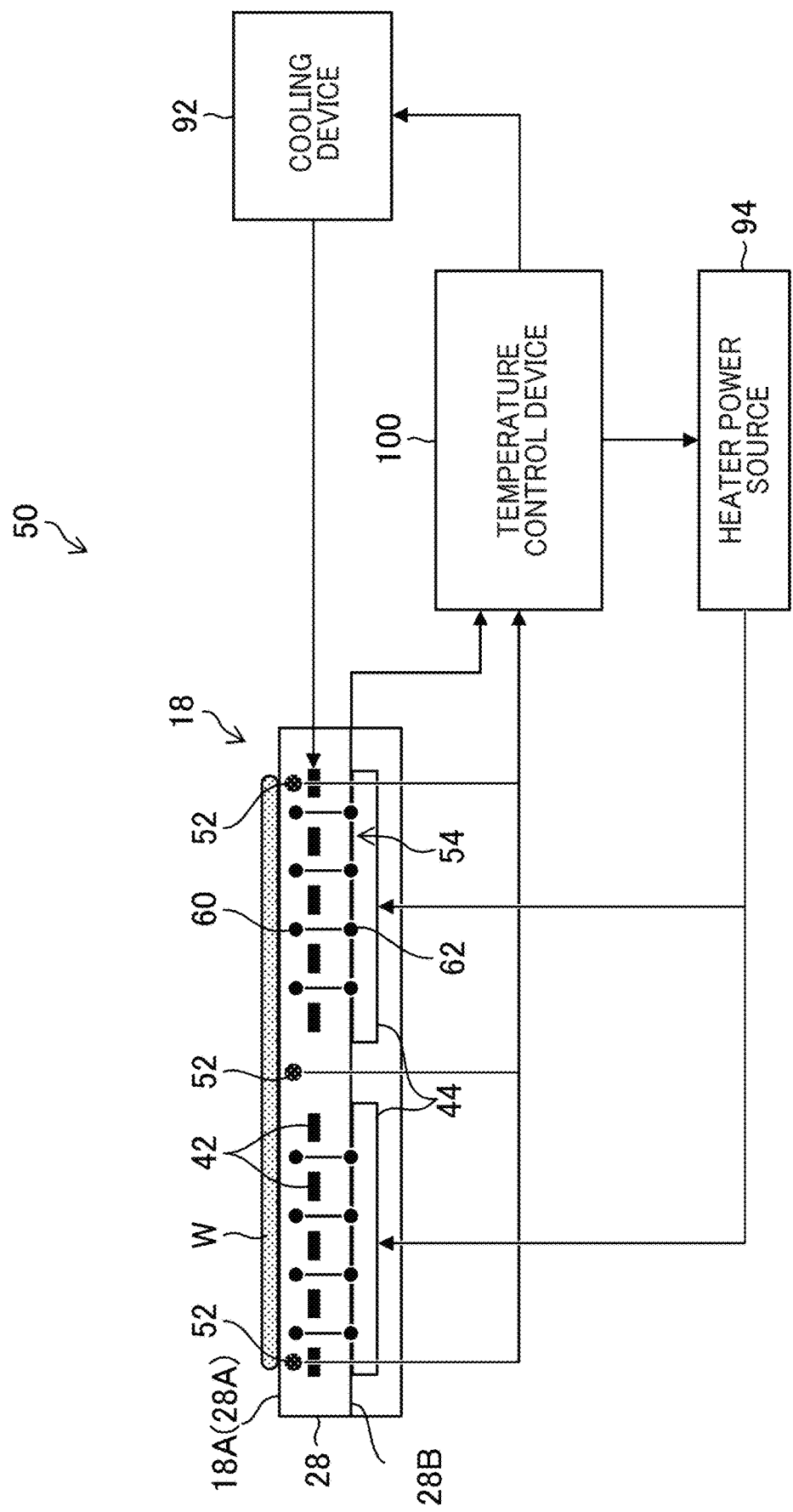
FIG. 2 is a schematic configuration diagram of a temperature control system in a first embodiment.
Figure 3:
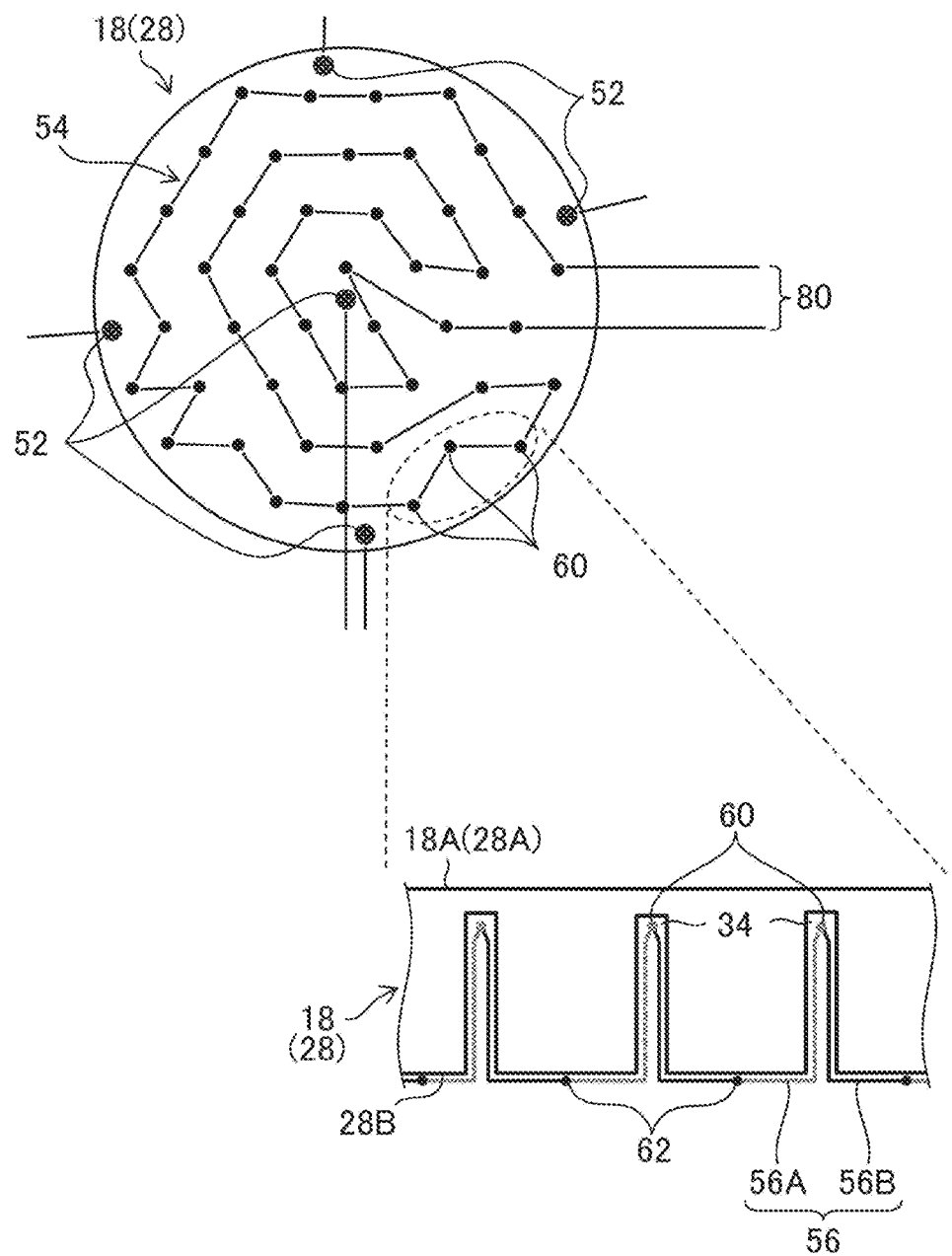
FIG. 3 shows a schematic plan view and an enlarged sectional view illustrating an internal structure of the wafer chuck.

FIG. 2 is a schematic configuration diagram of the temperature control system 50 in a first embodiment. FIG. 3 is a schematic plan view showing the internal structure of the wafer chuck 18.

As shown in FIG. 2, the temperature control system 50 in the first embodiment includes the wafer chuck 18, the temperature control device 100, temperature sensors 52, a heat flow sensor 54, cooling plates 42, and heaters 44. The cooling plates 42 and the heaters 44 are components of the heating and cooling unit 40 described above.

The wafer chuck 18 includes a chuck top suction plate 28. The chuck top suction plate 28 constitutes a part on an upper side (a side where the wafer W is disposed) of the wafer chuck 18. The chuck top suction plate 28 has a chuck top front surface 28A that corresponds to the holding surface 18A of the wafer chuck 18, and a chuck top back surface 28B that is opposite to the chuck top front surface 28A (holding surface 18A). The cooling plates 42 are disposed in the chuck top suction plate 28. The heaters 44 are disposed at positions under the chuck top suction plate 28 (opposite to the part on which the wafer W is disposed) and in contact with the chuck top back surface 28B.

A cooling device 92 is connected to the cooling plates 42. Under control by the temperature control device 100, coolant is supplied from the cooling device 92 to the cooling plates 42. A heater power source 94 is connected to the heaters 44. Under control by the temperature control device 100, heater power is supplied from the heater power source 94 to the heaters 44.

The temperature sensors 52 are provided in the wafer chuck 18 (chuck top suction plate 28). Each temperature sensor 52 is made up of, for example, a resistance temperature detector (RTD), a thermocouple (TC) or the like.

The temperature sensors 52 are uniformly (evenly) distributed and disposed (disposed in a distributed manner) in the wafer chuck 18 (chuck top suction plate 28) in plan view (view in Z-direction) in order to detect an after-mentioned reference temperature Tref of the wafer chuck 18 (see FIG. 3). In this embodiment, for example, as shown in FIG. 3, five temperature sensors 52 are provided in the chuck top suction plate 28. Specifically, one temperature sensor 52 among the five temperature sensors 52 is disposed at the center of the wafer chuck 18, and the remaining four temperature sensors 52 are uniformly (evenly) disposed along the circumferential direction on the periphery of the wafer chuck 18. The temperature sensors 52 may be non-uniformly distributed and disposed in the wafer chuck 18 in plan view as long as temperature sensors 52 can detect the reference temperature Tref of the wafer chuck 18.

Note that "distributed and disposed" means that the temperature sensors 52 are disposed at predetermined intervals, and indicates an arrangement form where when the device to be measured on the wafer W to be tested generates heat, at least one temperature sensor 52 among the temperature sensors 52 can detect the temperature of the wafer chuck 18 at a part that is not affected by the heat generation (corresponding to the reference temperature Tref described above). That is, this indicates a state where the temperature sensors 52 are disposed with their distances being separated so that at least one temperature sensor 52 can detect the reference temperature Tref of the wafer chuck 18, instead of a state where the temperature sensors 52 which are provided according to the number of the devices to be measured on the wafer W, are disposed close to respective the devices to be measured.

The heat flow sensor 54 is provided, together with the temperature sensors 52, in the wafer chuck 18 (chuck top suction plate 28). The heat flow sensor 54 detects the amount of heat generation of the devices to be measured as a heat flow (heat flux: an amount of heat flowing through a unit area in a unit time period). Note that "heat flow sensor" is also referred to as "heat flux sensor".

As shown in FIGS. 2 and 3, the heat flow sensor 54 is formed by connecting thermocouples 56, as many as the number of temperature measurement points, in series. Output wires 80 are provided at both ends of the heat flow sensor 54. Each output wires 56 is provided for outputting an output signal (voltage signal) (hereinafter referred as "sensor signal") indicating the heat flow (heat flux) detected by each heat flow sensor 54. The output wires 80 are connected to the temperature control device 100, and is configured such that the sensor signal output from the heat flow sensor 54 may be input into the temperature control device 100.

Each thermocouple 56 is configured by connecting metals 56A and 56B that are of different types, and includes a temperature measurement point 60 serving as a connecting part between the metal 56A and the 56B. That is, the heat flow sensor 54 includes the temperature measurement points 60 for the respective thermocouples 56. The temperature measurement points 60 are respectively disposed at upper positions (positions on a side closer to the chuck top front surface 28A) in the chuck top suction plate 28, and are densely disposed over the entire wafer chuck 18 in plan view of the wafer chuck 18 (view in the Z-direction). Note that "densely disposed" indicates an arrangement form where in plan view of the wafer chuck 18, the temperature measurement points 60 are disposed in a state of having at least a higher arrangement density than the arrangement density of the temperature sensors 52 so as to be capable of detecting the amount of heat, which partially occurs in the wafer W, generated in each device to be measured. Preferably, in view of detecting the amount of heat, which partially occurs in the wafer W, generated in each device to be measured, the temperature measurement points 60 are uniformly and densely disposed over the entire wafer chuck 18 in plan view of the wafer chuck 18. However, the disposition is not limited to this example. The temperature measurement points 60 are not necessarily uniformly disposed.

The thermocouples 56 are connected in series, and the heat flow sensor 54 includes reference junctions 62 that are connecting parts between thermocouples 56 adjacent to each other (i.e., the connecting part between the metal 56A of one thermocouple 56 and the metal 56B of another thermocouple 56 among every adjacent pair of thermocouples 56). That is, the heat flow sensor 54 includes multiple reference junctions 62. Each reference junction 62 is disposed at a predetermined position on the chuck top back surface 28B which is the lower side of the chuck top suction plate 28. Note that in this embodiment, for example, each reference junction 62 is disposed at an intermediate position between every adjacent pair of thermocouples 56 connected in series in plan view of the wafer chuck 18 (Z-direction view).

Here, an example of specific attachment form of the heat flow sensor 54 to the wafer chuck 18 is described. As shown in FIG. 3, which is an enlarged diagram, on the chuck top suction plate 28 included in the wafer chuck 18, the thermocouple housing bores 34 are provided at positions corresponding to the respective temperature measurement points 60. Thermocouple housing bores 34 are solid-bottomed elongated bores that are open on the chuck top back surface 28B of the chuck top suction plate 28. The distal end parts (parts closer to the corresponding temperature measurement point 60) of the metal 56A and the metal 56B, which constitute the thermocouple 56, are stored in the corresponding thermocouple housing bore 34. At the bottom (closer to the chuck top front surface 28A; upper in FIG. 3) of each thermocouple housing bore 34, the distal end parts of the metals 56A and 56B constituting the corresponding thermocouple 56 are connected to each other, thus constituting the temperature measurement point 60.

The base parts of the metals 56A and 56B constituting the thermocouples 56 are disposed along the chuck top back surface 28B outside of the thermocouple housing bores 34, and are connected to the base parts of the metals 56A or 56B of adjacent other thermocouples 56 which are connected in-series. Thus, the base parts of the metals 56A and 56B constitute the reference junctions 62.

According to the form where the thermocouple housing bores 34 are provided in the wafer chuck 18 (chuck top suction plate 28) as described above, the thermocouples 56, which are connected in series, may be effectively and easily embedded in the wafer chuck 18. Note that in this embodiment, the thermocouple housing bores 34 are provided in the wafer chuck 18 is described as a preferable form. However, as long as the temperature measurement points 60 of the heat flow sensor 54 may be densely disposed over the entire wafer chuck 18 in plan view of the wafer chuck 18, the form of attaching the heat flow sensor 54 to the wafer chuck 18 is not specifically limited.

Figure 4:
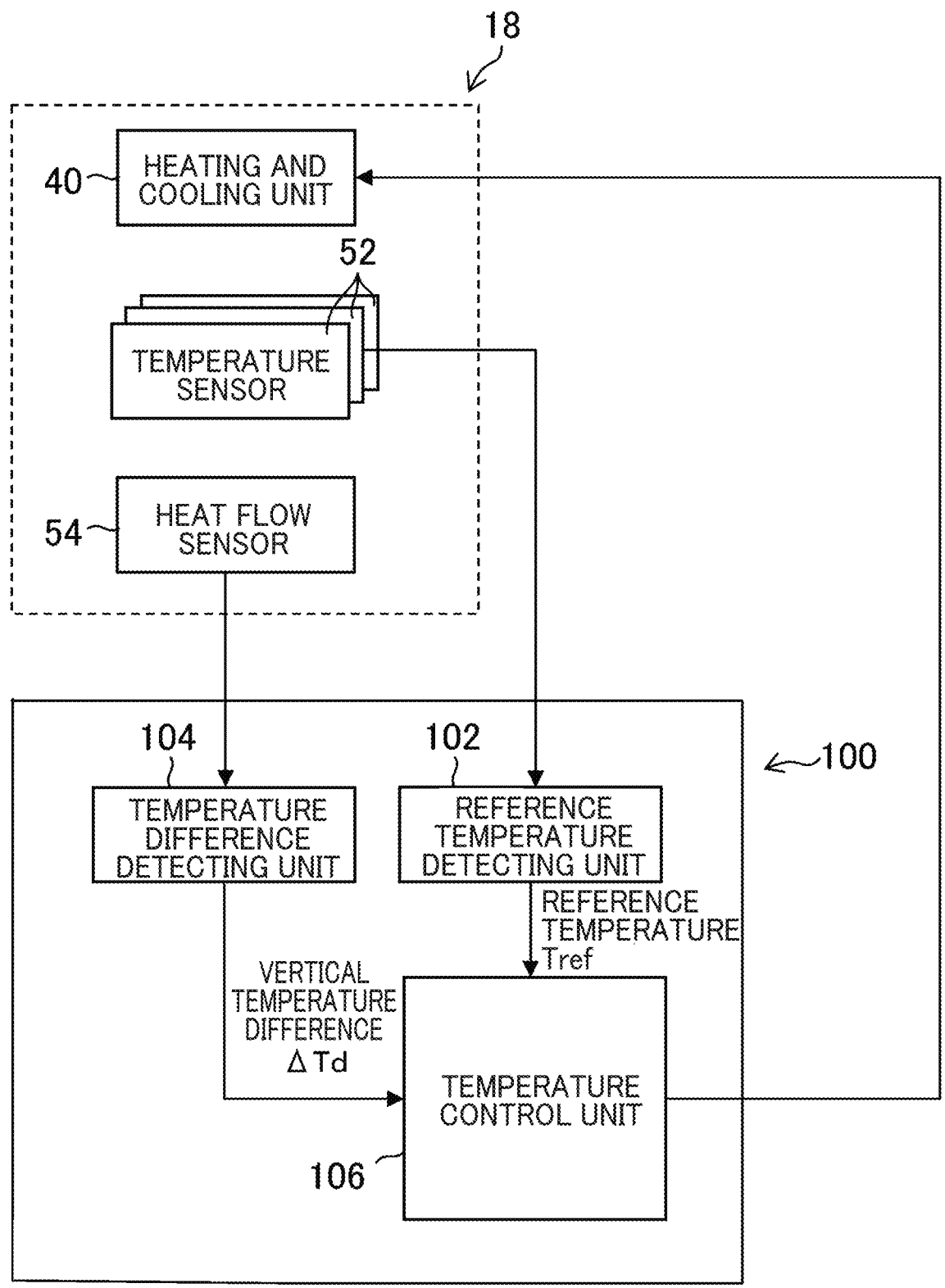
FIG. 4 is a functional block diagram showing the configuration of a temperature control device in the first embodiment.

FIG. 4 is a functional block diagram showing the configuration of the temperature control device 100. The temperature control device 100 includes a computational circuit made up of various processors, memories and the like. The various processors include a CPU (central processing unit), a GPU (graphics processing unit), an ASIC (application specific integrated circuit), and programmable logic devices [e.g., an SPLD (simple programmable logic devices), a CPLD (complex programmable logic device), and an FPGA (field programmable gate arrays)]. Note that various functions of the temperature control device 100 may be achieved by a single processor, or the same or different types of processors.

The temperature control device 100 executes a control program, not shown, and functions as the reference temperature detecting unit 102, the temperature difference detecting unit 104, and the temperature control unit 106.

The reference temperature detecting unit 102 is connected to the temperature sensors 52, and obtains the temperature of the wafer chuck 18 detected by each of the temperature sensors 52. The reference temperature detecting unit 102 detects (selects) the lowest temperature among, or the average or median of the temperatures detected by the respective temperature sensors 52, as the reference temperature Tref of the wafer chuck 18. The reference temperature Tref detected by the reference temperature detecting unit 102 is input into the temperature control unit 106. The reference temperature detecting unit 102 is an example of the reference temperature detecting unit in the present invention.

Note that the "reference temperature Tref" indicates the temperature of the wafer chuck 18 at a part that is not affected by heat generation when the device to be measured on the wafer W as a test target generates heat. In this embodiment, the temperature sensor 52 positioned farthest from the device to be measured that is partially generating heat on the wafer W among the temperature sensors 52 is least affected by heat generation of the device to be measured, and detects the lowest temperature. Accordingly, the lowest temperature among the temperatures detected by the respective temperature sensors 52 is selected as the reference temperature Tref. However, in some cases, detection of increase in temperature of the wafer chuck 18 due to heat generation by the devices may be excellent in temperature followability of the wafer chuck 18 in the temperature control. There is also a method of adopting the average, median or the like of the temperatures detected by the respective temperature sensors 52, as the reference temperature Tref of the wafer chuck 18.

The reference temperature Tref detected by the reference temperature detecting unit 102 may be regarded as a temperature substantially equal to the temperature on the chuck top back surface 28B (i.e., a position where the reference junctions 62 of the heat flow sensor 54 are disposed) of the chuck top suction plate 28 at a part of the wafer chuck 18 that is least affected by heat generation by the device to be measured. Thus, the reference temperature Tref is used as a reference temperature for obtaining the temperature T at the heat generating part temperature measurement point from an after-mentioned vertical temperature difference ΔTd. Note that the "heat generating part temperature measurement point" indicates the temperature measurement point 60 at a position corresponding to the heat generating part of the wafer W among the temperature measurement points 60 constituting the heat flow sensor 54.

The temperature difference detecting unit 104 is connected to the heat flow sensor 54, and obtains a sensor signal output from the heat flow sensor 54. The temperature difference detecting unit 104 extracts an electromotive force (thermal electromotive force) from the sensor signal output from the heat flow sensor 54, and calculates the vertical temperature difference ΔTd at the heat generating part temperature measurement point, based on the electromotive force.

The temperature control unit 106 obtains the reference temperature Tref from the reference temperature detecting unit 102, and obtains the vertical temperature difference ΔTd at the heat generating part temperature measurement point from the temperature difference detecting unit 104. The temperature control unit 106 then calculates the temperature T at the heat generating part temperature measurement point, based on the reference temperature Tref and the vertical temperature difference ΔTd at the heat generating part temperature measurement point. Furthermore, the temperature control unit 106 adopts the calculated temperature T at the heat generating part temperature measurement point as a control temperature (PV value), and controls the heating and cooling unit 40 so that the control temperature may be equal to a preset target temperature (e.g., a test temperature). The temperature control unit 106 is an example of a temperature control unit in the present invention.

<Principle of Temperature Control>

Next, the principle of temperature control in this embodiment is described in detail.

At the heat flow sensor 54 according to this embodiment, a temperature difference between the front and back of the heat flow sensor 54 occurs when a heat flow passes in the thickness direction (Z-direction) of the wafer chuck 18 through the heat flow sensor 54 due to heat generation of the device to be measured on the wafer W. That is, when the heat flow passes through the heat flow sensor 54 in the thickness direction of the wafer chuck 18, a temperature difference occurs between one side (the chuck top front surface 28A side) and the other side (chuck top back surface 28B side) of the wafer chuck 18. Accordingly, an electromotive force occurs between the one side and the other side of the wafer chuck 18 by the Seebeck effect. The heat flow sensor 54 outputs, as the sensor signal, the electromotive force (thermal electromotive force) caused based on the heat flow flowing between the front and back of the heat flow sensor 54.

Because of the configuration described above, the heat flow sensor 54 in this embodiment may calculate the temperature difference between the front and back of the heat flow sensor 54, based on the sensor signal output by the heat flow sensor 54, i.e., the electromotive force at the heat flow sensor 54.

Here, when it is assumed that the electromotive force of the heat flow sensor 54 is V, and the heat flow flowing through the heat flow sensor 54 is q, a relationship of q=α·V (α is a sensor constant) holds. When it is assumed that the temperature difference between the front and back of the heat flow sensor 54 is ΔT, the heat flow q passing through the heat flow sensor 54 is proportional to the temperature difference ΔT at the heat flow sensor 54. Consequently, there is a correlation between the electromotive force V at the heat flow sensor 54, and the temperature difference ΔT at the heat flow sensor 54. Accordingly, when data indicating their relationship (conversion data between the electromotive force and the temperature difference) are obtained in advance through experiment or design, the temperature difference ΔT may be obtained from the electromotive force at the heat flow sensor 54.

When it is assumed that the temperature difference obtained from the electromotive force at the heat flow sensor 54 is ΔT [° C.], the rate of heat passing through the heat flow sensor 54 is Q [W], the area of the heat flow sensor 54 is S [m²], the heat flow distance of the heat flow sensor 54 (the distance between the front and back of the heat flow sensor 54) is Lj [m], and the thermal conductivity of the material in which the heat flow sensor 54 is embedded is k [W/mK], the heat rate Q passing through the heat flow sensor 54 is obtained by the following Expression (1).

[Formula 1]

$$Q = -k \cdot S \frac{\Delta T}{Lj} \qquad \text{Expression (1)}$$

When it is assumed that the heat rate at the heat generating part is Qd [W], and the area (heat generating part area) of the heat generating part is Sd [m²], the heat rate Qd at the heat generating part is as represented by the following Expression 2.

[Formula 2]

$$Qd = Q\frac{Sd}{S} = -k \cdot S\frac{\Delta T}{Lj} \cdot \frac{Sd}{S} = -k \cdot Sd\frac{\Delta T}{Lj} \quad \text{Expression (2)}$$

In other words, the heat rate Qd at the heat generating part has a value obtained by multiplying the heat rate Q passing through the heat flow sensor 54 by the area ratio (Sd/S) of the heat generating part area Sd to the area S of the heat flow sensor 54. Furthermore, when the heat rate Q passing through the heat flow sensor 54 is replaced using the relational expression represented by Expression (1), heat rate Qd at the heat generating part may be represented by the temperature difference ΔT obtained from the electromotive force at the heat flow sensor 54.

Further, when it is assumed that the vertical temperature difference at the heat generating part temperature measurement point is ΔTd [° C.], the vertical temperature difference ΔTd at the heat generating part temperature measurement point is as represented by the following Expression (3).

[Formula 3]

$$\Delta Td = \frac{Qd \cdot Lj}{-k \cdot Sd} = \frac{-k \cdot S\frac{\Delta T}{Lj} \cdot Lj}{-k \cdot Sd} = \Delta T\frac{S}{Sd} \quad \text{Expression (3)}$$

In other words, the vertical temperature difference ΔTd at the heat generating part temperature measurement point has a relationship that is proportional to the heat rate Qd at the heat generating part and to the heat flow distance Lj, and is inversely proportional to the heat generating part area Sd. When the heat rate Qd at the heat generating part is replaced using the relational expression represented by Expression (2), the vertical temperature difference ΔTd at the heat generating part temperature measurement point is a value obtained by multiplying the temperature difference ΔT obtained from the electromotive force at the heat flow sensor 54 by the reciprocal of the area ratio described above (i.e., the area ratio of the area S of the heat flow sensor 54 to the heat generating part area Sd).

As described above, the vertical temperature difference ΔTd at the heat generating part temperature measurement point is the temperature difference obtained by converting the temperature difference ΔT obtained from the electromotive force at the heat flow sensor 54 using the heat generating part area Sd. Accordingly, when it is assumed that the temperature at the heat generating part temperature measurement point is T [° C.], the temperature T at the heat generating part temperature measurement point is a value obtained by adding the vertical temperature difference ΔTd at the heat generating part temperature measurement point to the reference temperature Tref (the lowest temperature among the temperatures detected by the respective temperature sensors 52), as represented by the following Expression (4).

[Formula 4]

$$T = Tref + \Delta Td \quad \text{Expression (4)}$$

Note that the reference temperature Tref is the reference temperature at a part (i.e., the back side (chuck top back surface 28B) of the heat flow sensor 54) which is the reference of the vertical temperature difference ΔTd at the heat generating part temperature measurement point. The temperature sensor 52 at a position farthest from the device to be measured that is partially generating heat in the wafer W, detects the lowest temperature. Accordingly, the temperature detected by this temperature sensor 52 may be assumed to be substantially equal to the temperature on the back side (chuck top back surface 28B) of the heat flow sensor 54. Consequently, as shown in the Expression (4), the temperature T at the heat generating part temperature measurement point may be obtained by adding the vertical temperature difference ΔTd at the heat generating part temperature measurement point to the reference temperature Tref detected by the reference temperature detecting unit 102.

<Concept of Calculation Example of Temperature of Heat Generating Part>

Figure 5:
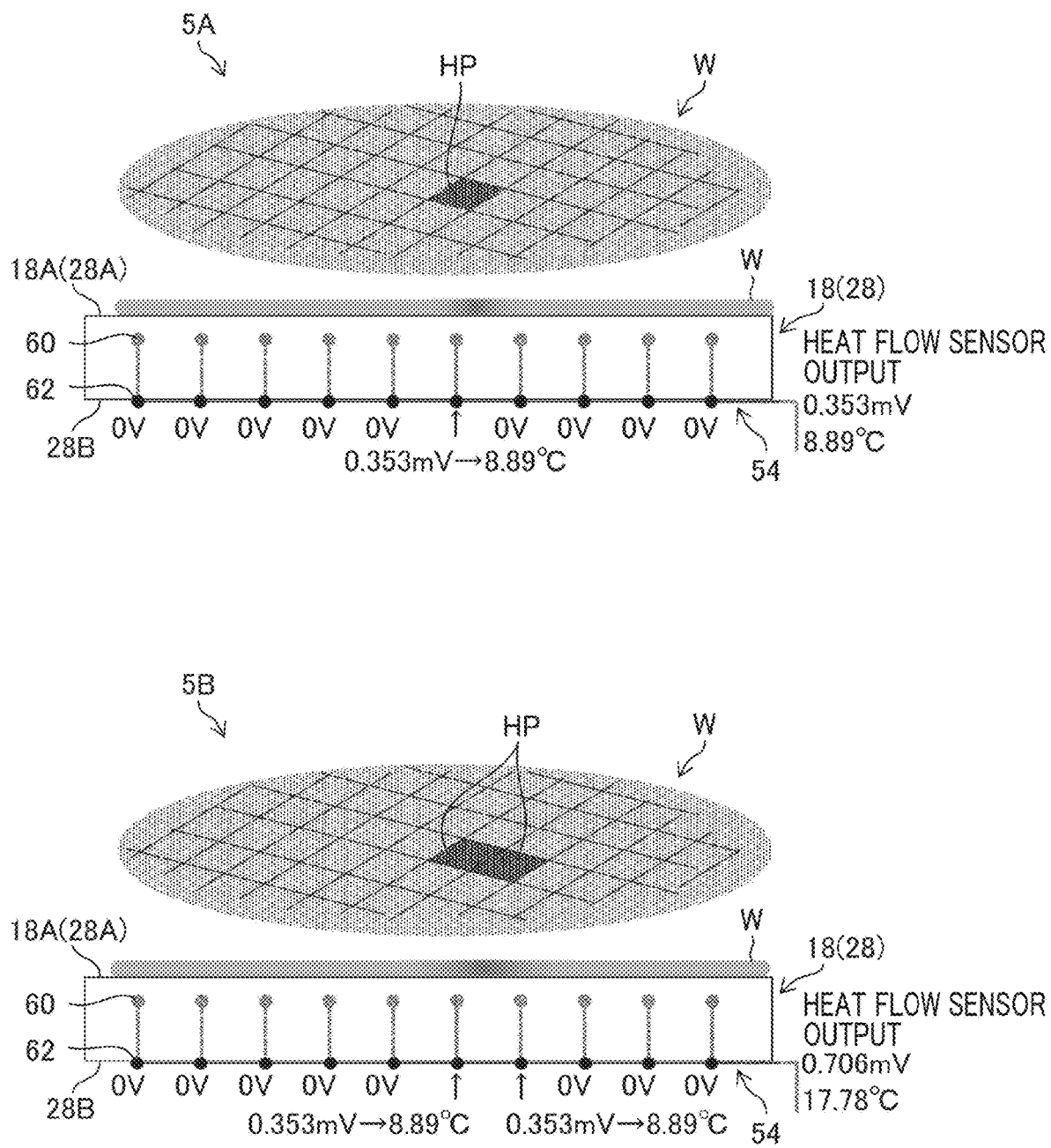
FIG. 5 is a conceptual diagram of a calculation example of the area of a heat generating part obtained from a heat flow sensor.

FIG. 5 is a conceptual diagram of a calculation example of the area of the heat generating part obtained from the heat flow sensor 54. Note that the calculation example described below assumes the following conditions as an example.

The heat flow distance of the heat flow sensor 54: Lj=0.01 [m]

The thermal conductivity of the material in which the heat flow sensor 54 is embedded: k=180 [W/mK].

[In a Case where there is One Heat Generating Part]

Reference numeral 5A in FIG. 5 designates an example of the temperature difference ΔT obtained from the electromotive force at the heat flow sensor 54 in a case where the number of heat generating parts HP is one in the wafer W. It is herein assumed that the heat rate of the heat generating part HP is Qd=100 [W], and the area of the heat generating part is Sd=0.000625 [m²] (25 mm×25 mm)

In the example designated by reference numeral 5A in FIG. 5, the electromotive force at the heat flow sensor 54 is 0.353 [mV], and the temperature difference obtained from the electromotive force is ΔT=8.89[° C.].

Meanwhile, an actual vertical temperature difference ΔTd is obtained from the heat rate Qd of the heat generating part HP using the leftmost relational expression in Expression (3), and the following Expression (5) holds. Note that the sign of the vertical temperature difference ΔTd at the heat generating part temperature measurement point in this case is determined depending on the direction of the heat flow passing through the heat flow sensor 54.

[Formula 5]

$$\Delta Td = \frac{Qd \cdot Lj}{-k \cdot Sd} = \frac{100 \times 0.01}{-180 \times 0.000625} = \frac{1}{-0.1125} = -8.889[°C] \quad \text{Expression (5)}$$

In the case of the example designated by 5A in FIG. 5, the temperature difference ΔT obtained from the electromotive force at the heat flow sensor 54 is equal to the absolute value of the vertical temperature difference ΔTd obtained from the heat rate Qd of the heat generating part HP (i.e., ΔT=|ΔTd|).

[In a Case where there are Two Heat Generating Parts]

Reference numeral 5B in FIG. 5 designates an example of the temperature difference ΔT obtained from the electromotive force at the heat flow sensor 54 in a case where the number of heat generating parts HP is two in the wafer (a case of a heat generating area twice as large as the heat generating area of the heat generating part HP shown in reference numeral 5A in FIG. 5). It is herein assumed that the heat rate of the heat generating part HP is Qd=200 [W], and the area of the heat generating part is Sd=0.00125 [m²] (25 mm×50 mm)

In the example designated by reference numeral 5B in FIG. 5, the electromotive force at the heat flow sensor 54 is 0.706 [mV], and the temperature difference obtained from the electromotive force V is ΔT=17.78[° C.].

Meanwhile, the vertical temperature difference ΔTd at the heat generating part temperature measurement point is obtained from the heat rate Qd of the heat generating part HP using the leftmost relational expression in Expression (3), and the following Expression (6) holds. Note that the sign of the vertical temperature difference ΔTd at the heat generating part temperature measurement point in this case is determined depending on the direction of the heat flow passing through the heat flow sensor 54.

[Formula 6]

$$\Delta Td = \frac{Qd \cdot Lj}{-k \cdot Sd} = \frac{200 \times 0.01}{-180 \times 0.00125} = \frac{2}{-0.225} = -8.889[°C] \quad \text{Expression (6)}$$

In the example designated by reference numeral 5B in FIG. 5, the heat generating area of the heat generating part HP in the wafer W is twice as large as that in the case of the example designated by reference numeral 5A in FIG. 5. Consequently, the electromotive force at the heat flow sensor 54 increases proportionally to the heat generating area of the heat generating part HP, so as to be twice accordingly. Thus, according to comparison between absolute values of the temperature differences, the temperature difference ΔT obtained from the electromotive force at the heat flow sensor 54 becomes twice as large as the vertical temperature difference ΔTd at the heat generating part temperature measurement point obtained by the heat rate Qd of the heat generating part HP.

As described above, the electromotive force at the heat flow sensor 54 changes according to the change in area of the heat generating part HP in the wafer W, and according to the change, the temperature difference ΔT obtained from the electromotive force also changes. That is, the temperature difference ΔT obtained from the electromotive force at the heat flow sensor 54 is an apparent temperature difference that changes according to change in area of the heat generating part HP, and deviates from the actual temperature difference. Accordingly, in this embodiment, a value obtained by converting the temperature difference ΔT calculated from the electromotive force at the heat flow sensor 54 using the heat generating part area Sd is adopted as the vertical temperature difference ΔTd at the heat generating part temperature measurement point, so as to obtain the temperature difference that is substantially equal to the actual temperature difference at the heat generating part temperature measurement point.

<Method of Obtaining Actual Control Temperature>

Next, a method of obtaining the actual control temperature (the vertical temperature difference ΔTd at the heat generation temperature measurement point) performed by the temperature control device 100 in the embodiment is described.

While the principle of temperature control in this embodiment is as described above, the output value (electromotive force) of the actual heat flow sensor 54 is determined based on the number of thermocouples 56 constituting the heat flow sensor 54 and their mounting density (i.e., the area per pair of thermocouples 56). Accordingly, in this embodiment, the area S in which the heat flow sensor 54 is embedded is calculated as an area Ss per pair of thermocouples 56, thus obtaining the vertical temperature difference ΔTd at the heat generating part temperature measurement point in the expressions (1) to (3) described above. Note that the calculation example of the vertical temperature difference ΔTd at the heat generating part temperature measurement point described below is an example, and assumes the following conditions.

The area (φ300 mm) in which the heat flow sensor is embedded: Sd=0.070875 [m²]

The number of temperature measurement points of the heat flow sensor: Ns=114 [points]

The area per pair of thermocouple: Ss=SD÷Ns=0.070875÷114=0.000622 [m²]=S

[In a Case where there is One Heat Generating Site]

In the example designated by reference numeral 5A in FIG. 5, provided that the area of the heat generating part is Sd=0.000625 [m²] (25 mm×25 mm), the electromotive force at the heat flow sensor 54 is 0.353 [mV], and the temperature difference obtained from the electromotive force is ΔT=8.89[° C.]. The vertical temperature difference ΔTd at the heat generating part temperature measurement point is obtained by converting the temperature difference ΔT obtained from the electromotive force at the heat flow sensor 54, using the heat generating part area Sd, as represented by the following Expression (7).

[Formula 7]

$$\Delta Td = \Delta T \frac{S}{Sd} = 8.89 \frac{0.000622}{0.000625} = \quad \text{Expression (7)}$$
$$8.89 \times 0.9952 = 8.847[°C]$$

[In Case where there are Two Heat Generating Sites]

In the example designated by reference numeral 5B in FIG. 5, it is assumed that the area of the heat generating part is Sd=0.00125 [m²] (25 mm×50 mm), the electromotive force at the heat flow sensor 54 is 0.706 [mV], and the temperature difference obtained from the electromotive force is ΔT=17.78[° C.]. The vertical temperature difference ΔTd at the heat generating part temperature measurement point is obtained by converting the temperature difference ΔT obtained from the electromotive force at the heat flow sensor 54, using the heat generating part area Sd, as represented by the following Expression (8).

[Formula 8]

$$\Delta Td = \Delta T \frac{S}{Sd} = 17.78 \frac{0.000622}{0.00125} = \quad \text{Expression (8)}$$
$$17.78 \times 0.4976 = 8.847[°C]$$

As described above, in the temperature control device 100 in this embodiment, even if the area of the heat generating part HP changes, the vertical temperature difference ΔTd at the heat generating part temperature measurement point (actual temperature difference) may be calculated from the temperature difference ΔT (apparent temperature difference) obtained from the electromotive force at the heat flow sensor 54. In controlling the heating and cooling unit 40, the value obtained by adding the vertical temperature difference ΔTd at the heat generating part temperature measurement point to the reference temperature Tref (the temperature substantially corresponding to the temperature on the back of the heat flow sensor 54) detected by the reference temperature detecting unit 102 is adopted as the temperature T at the heat generating part temperature measurement point, the temperature T is adopted as the control temperature (PV value), so that the temperature of the wafer chuck 18 may be appropriately controlled depending on the heat generation state of the device to be measured on the wafer W.

<Temperature Control Method>

Figure 6:
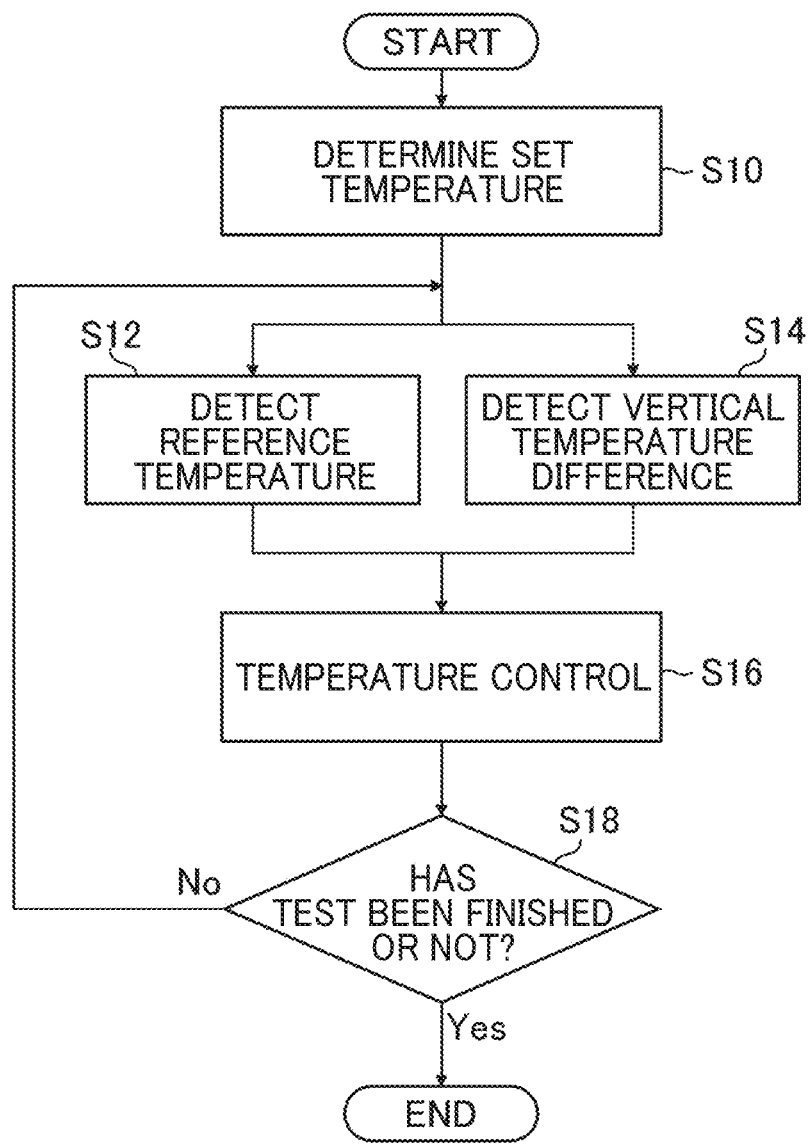
FIG. 6 is a flowchart showing an example of a temperature control method in the temperature control system in the first embodiment.

Next, a temperature control method in the temperature control system 50 in the first embodiment is described. FIG. 6 is a flowchart showing an example of the temperature control method in the temperature control system 50 in the first embodiment.

First, the wafer W is held on the wafer chuck 18, alignment between the wafer W and the probe card 24 is achieved, and subsequently, an electrical property test of the wafer W is started. From start to end of the electrical property test of the wafer W, the flowchart shown in FIG. 6 is executed.

After the flowchart in FIG. 6 is started, first, a set temperature determining step (step S10) is performed. In the set temperature determining step, the temperature control unit 106 determines the set temperature of the wafer chuck 18. The set temperature of the wafer chuck 18 is a target temperature (e.g., a test temperature) when the temperature control unit 106 executes the temperature control for the wafer chuck 18. Note that the set temperature of the wafer chuck 18 is not necessarily equal to the test temperature, and may be, for example, the set temperature may be set based on the test temperature.

After the set temperature determining step is performed, a reference temperature detecting step (step S12) and a vertical temperature difference detecting step (step S14) are performed in parallel. The reference temperature detecting step and the vertical temperature difference detecting step are not necessarily executed at the same timing (at the same time). However, in a control temperature determining step (step S16) that is subsequently performed, the control temperature is determined based on the detection results in both the steps. Accordingly, it is preferable that the reference temperature detecting step and the vertical temperature difference detecting step be executed at the same timing.

In the reference temperature detecting step (step S12), the temperatures detected by the respective temperature sensors 52 are input into the reference temperature detecting unit 102. The reference temperature detecting unit 102 detects (select) the lowest temperature among the temperatures detected by the respective temperature sensors 52, as the reference temperature Tref of the wafer chuck 18. The reference temperature Tref of the wafer chuck 18 is a temperature serving as a reference when the temperature T at the heat generating part temperature measurement point is obtained from the after-mentioned vertical temperature difference ΔTd at the heat generating part temperature measurement point, and is a temperature that may be assumed to be a temperature substantially equal to the temperature on the back side (the chuck top back surface 28B of the chuck top suction plate 28) of the heat flow sensor 54. The reference temperature Tref detected by the reference temperature detecting step is input into the temperature control unit 106.

In the vertical temperature difference detecting step (step S14), the heat flow caused by partial heat generation in the wafer W held on the wafer chuck 18 is detected by the heat flow sensor 54, the sensor signal (electromotive force) output from the heat flow sensor 54 is input into the temperature difference detecting unit 104. The temperature difference detecting unit 104 obtains the temperature difference ΔT between the front side and back side of the heat flow sensor 54 from the electromotive force at the heat flow sensor 54. The temperature difference detecting unit 104 then calculates a value obtained by converting the temperature difference ΔT obtained from the electromotive force at the heat flow sensor 54, using the heat generating part area Sd, as the vertical temperature difference ΔTd at the heat generating part temperature measurement point. Here, the heat generating part area Sd is obtained by referring to test information (including the area of the device to be measured) stored in a memory unit (not shown). Since the method of calculating the vertical temperature difference ΔTd at the heat generating part temperature measurement point is as described above, the detailed description thereof is omitted here.

After the reference temperature detecting step and the vertical temperature difference detecting step are performed, a temperature control step (step S16) is performed. In the temperature control step, the temperature control unit 106 calculates the temperature T at the heat generating part temperature measurement point, based on the reference temperature Tref input from the reference temperature detecting unit 102 and on the vertical temperature difference ΔTd at the heat generating part temperature measurement point input from the temperature difference detecting unit 104. Specifically, the temperature T at the heat generating part temperature measurement point is obtained as a value obtained by adding the vertical temperature difference ΔTd to the reference temperature Tref (i.e., T=Tref+ΔTd).

The temperature control unit 106 adopts the thus calculated temperature T at the heat generating part temperature measurement point, as the control temperature (PV value), and controls the heating and cooling unit 40 so that the temperature T at the heat generating part temperature measurement point serving as the control temperature may approach the set temperature of the wafer chuck 18 determined in the set temperature determining step. For example, if the temperature T at the heat generating part temperature measurement point is lower than the set temperature, the heater power is supplied to the heaters 44 from the heater power source 94 according to control by the temperature control unit 106, and the heaters 44 heat the wafer chuck 18. If the temperature T at the heat generating part temperature measurement point is higher than the set temperature, the coolant is supplied from the cooling device 92 to the cooling plates 42 according to control by the temperature control unit 106, and the cooling plates 42 cool the wafer chuck 18. Accordingly, depending on the heat generation state of the device to be measured on the wafer W, temperature control (heating and cooling control) for the wafer chuck 18 is performed so that the temperature of the wafer chuck 18 (temperature T at the heat generating part temperature measurement point) can approach the set temperature.

After the temperature control step is performed as described above, a determining step (step S18) is performed. In the determining step, the temperature control unit 106 determines whether the electrical property test for the wafer W has been finished or not. If the temperature control unit 106 determines that the electrical property test for the wafer W has not been finished in the determining step (case of determination result of No), the processes from step S12 to step S18 are repeated. On the other hand, if the temperature control unit 106 determines that the electrical property test for the wafer W has been finished (case of determination result of Yes), the control by the temperature control unit 106 is finished. Thus, this flowchart is finished.

As described above, in the temperature control system 50 according to the embodiment, both the temperature sensors 52 and the heat flow sensor 54 which are disposed by connecting the thermocouples 56 in series (the temperature measurement points 60 are densely disposed over the entire wafer chuck 18), are embedded in the wafer chuck 18. The temperature control system 50 calculates the temperature T at the heat generating part temperature measurement point (the temperature of the wafer chuck 18 corresponding to the heat generating part of the wafer W), based on the detection results of the temperature sensors 52 and on the detection result of the heat flow sensor 54, and performs the temperature control (heating and cooling control) for the wafer chuck 18 so that the temperature T may be equal to a preliminarily set temperature. Accordingly, the temperature of the wafer chuck 18 may be appropriately controlled without increasing the number of temperature sensors 52 arranged in the wafer chuck 18.

Note that in the embodiment, the form where the five temperature sensors 52 are disposed in the wafer chuck 18 (chuck top suction plate 28) is described as a preferable form. The number of temperature sensors 52 disposed in the wafer chuck 18 is not limited so long as the number of temperature sensors 52 is sufficiently smaller than the number of devices to be measured on the wafer W, and allows detection of the reference temperature Tref of the wafer chuck 18. For example, a form where two to four temperature sensors 52 are disposed, or a form where six or more are disposed may be adopted. As long as the reference temperature Tref of the wafer chuck 18 may be detected, a form where a single temperature sensor 52 is disposed may be adopted. That is, to detect the reference temperature Tref of the wafer chuck 18, at least one temperature sensor 52 is required to be disposed in the wafer chuck 18.

In this embodiment, the case where the heat flow sensor 54 is made up of one sensor element (an integrated object where the thermocouples 56 are connected in series) is described as a preferable form. There is no limitation to this. The heat flow sensor 54 may be made up of multiple sensor elements.

Figure 7:
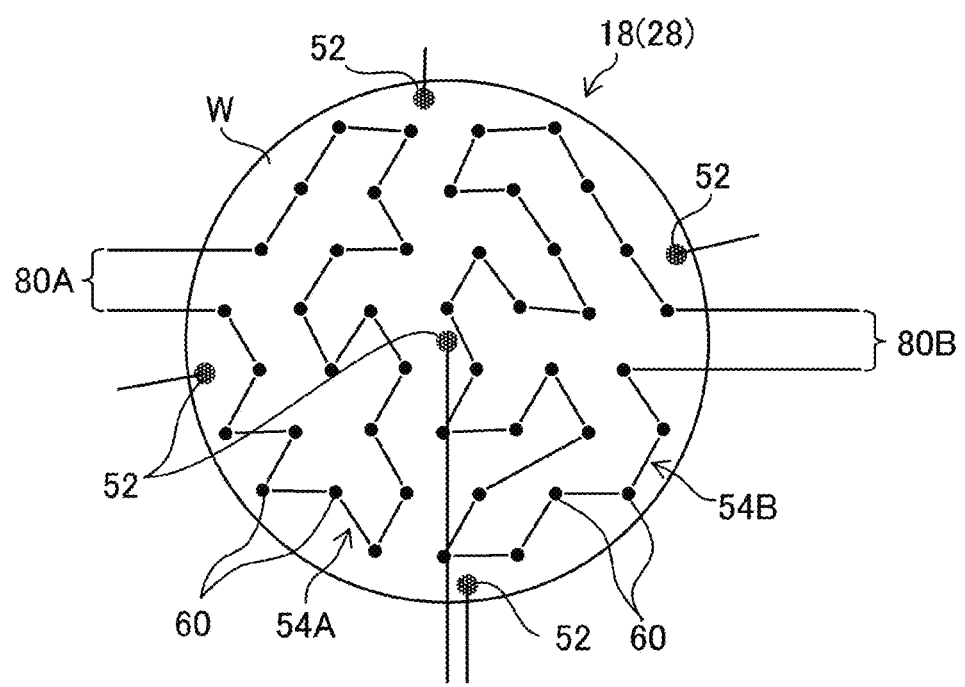
FIG. 7 shows a configuration example in a case where the heat flow sensor includes two sensor elements.

FIG. 7 shows a configuration example where the heat flow sensor 54 is made up of two sensor elements. FIG. 7 is a schematic plan view showing the internal structure of the wafer chuck 18. Note that FIG. 7 shows the configuration example where the heat flow sensor 54 is made up of two sensor elements, as an example. It is however a matter of course that the sensor may be made up of three or more sensor elements.

In the configuration example shown in FIG. 7, the heat flow sensor 54 is made up of two sensor elements 54A and 54B. Specifically, in plan view of the wafer chuck 18 (Z-direction view), the sensor element 54A is disposed in a region on one side (the left side in FIG. 7), and the sensor element 54B is disposed on the other side (the right side in FIG. 7) of the wafer chuck 18.

The two sensor elements 54A and 54B have a configuration basically similar to the configuration of the heat flow sensor 54 in the embodiment described above. The two sensor elements 54A and 54B are each configured to include thermocouples 56 connected in series, and each have temperature measurement points 60 densely disposed over the entire corresponding arrangement region.

The both ends of the two sensor elements 54A and 54B are respectively provided with output wires 80A and output wires 80B for outputting sensor signals to the temperature control device 100. Each of the output wires 80A and output wires 80B are connected to the temperature control device 100. It is configured such that the sensor signals output from the respective sensor elements 54A and 54B may be input into the temperature control device 100.

The temperature control device 100 obtains the vertical temperature difference ΔTd at the heat generating part temperature measurement point, based on the sensor signal (electromotive force) output from the sensor element disposed in the region where the device to be measured resides, between the two sensor elements 54A and 54B. Since the method of calculating the vertical temperature difference ΔTd at the heat generating part temperature measurement point is substantially similar to that in this embodiment, the detailed description thereof is omitted here.

In this embodiment, the configuration is described where: the cooling plates 42 are disposed as the heating and cooling unit 40 in the chuck top suction plate 28; and the heaters 44 are disposed on the back side (the opposite side of the side on which the wafer W is disposed) of the chuck top suction plate 28. However, the configuration is not limited to this. For example, other configuration examples described later may be adopted.

Figure 8:
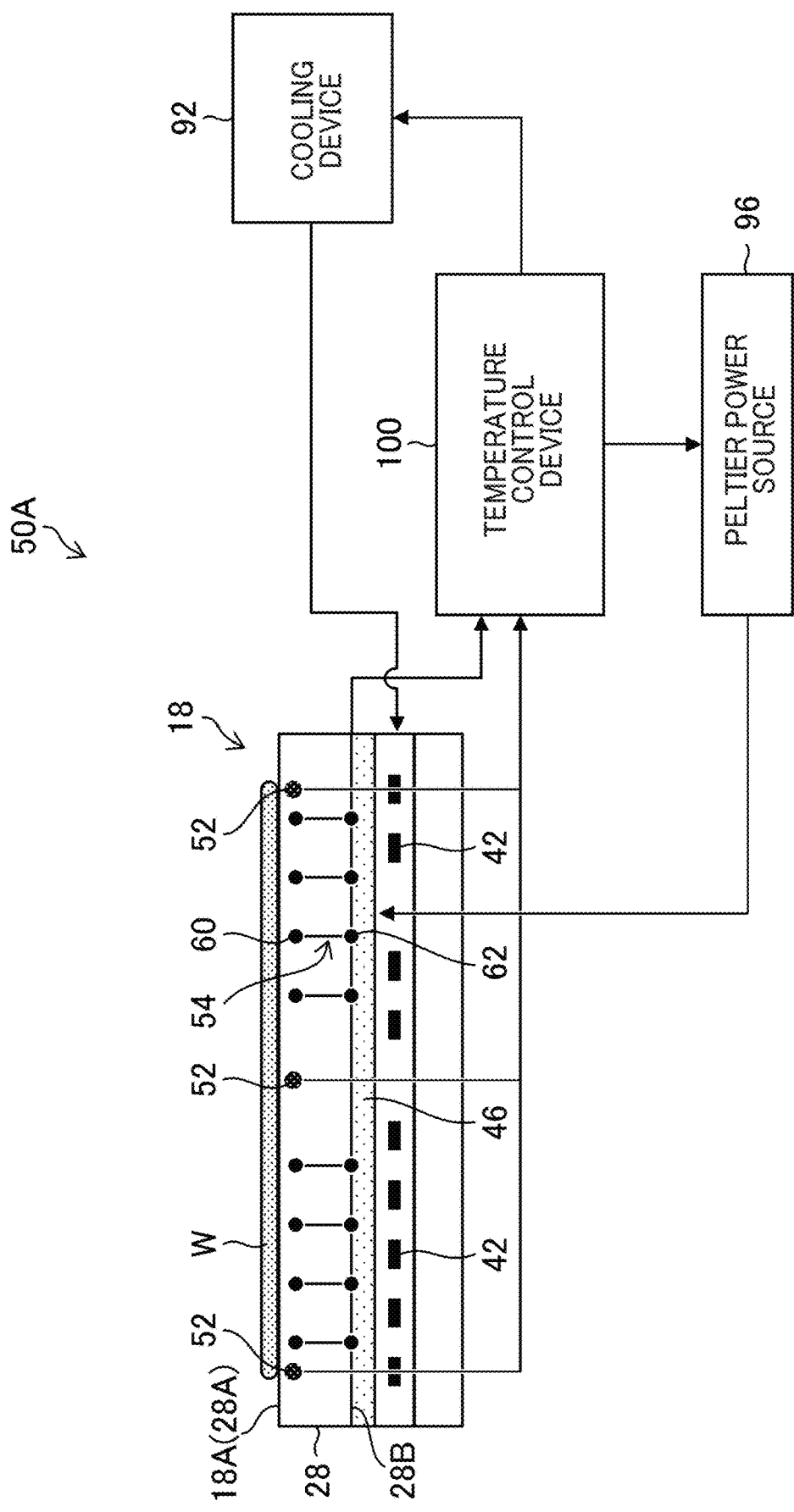
FIG. 8 is a schematic configuration diagram of a temperature control system according to a first modified example.

FIG. 8 is a schematic configuration diagram of a temperature control system 50A according to a first modified example. Note that parts common to those in the first embodiment are assigned the same symbols, and the description thereof is omitted.

As shown in FIG. 8, the temperature control system 50A according to the first modified example includes cooling plates 42, and a Peltier element 46. The cooling plates 42 and the Peltier element 46 are components of the heating and cooling unit 40, and are provided in the wafer chuck 18. Specifically, the Peltier element 46 is disposed in a state of being in contact with the back side (chuck top back surface 28B) of the chuck top suction plate 28. The cooling plates 42 are disposed on the opposite side of the chuck top suction plate 28, with the Peltier element 46 intervening therebetween. In other words, the Peltier element 46 is disposed between the chuck top suction plate 28 and the cooling plates 42.

A Peltier power source 96 is connected to the Peltier element 46. Under control by the temperature control device 100, Peltier power is supplied from the Peltier power source 96 to the Peltier element 46. The cooling device 92 is connected to the cooling plates 42. Under control by the temperature control device 100, coolant is supplied from the cooling device 92 to the cooling plates 42.

According to the first modified example, control is achieved with combination of heating by the Peltier element 46 and cooling by the cooling plates 42, thus allowing temperature control for the wafer chuck 18 in a manner similar to that of the first embodiment. Note that cooling by the Peltier element 46 may be further incorporated to the configuration so as to perform control.

Figure 9:
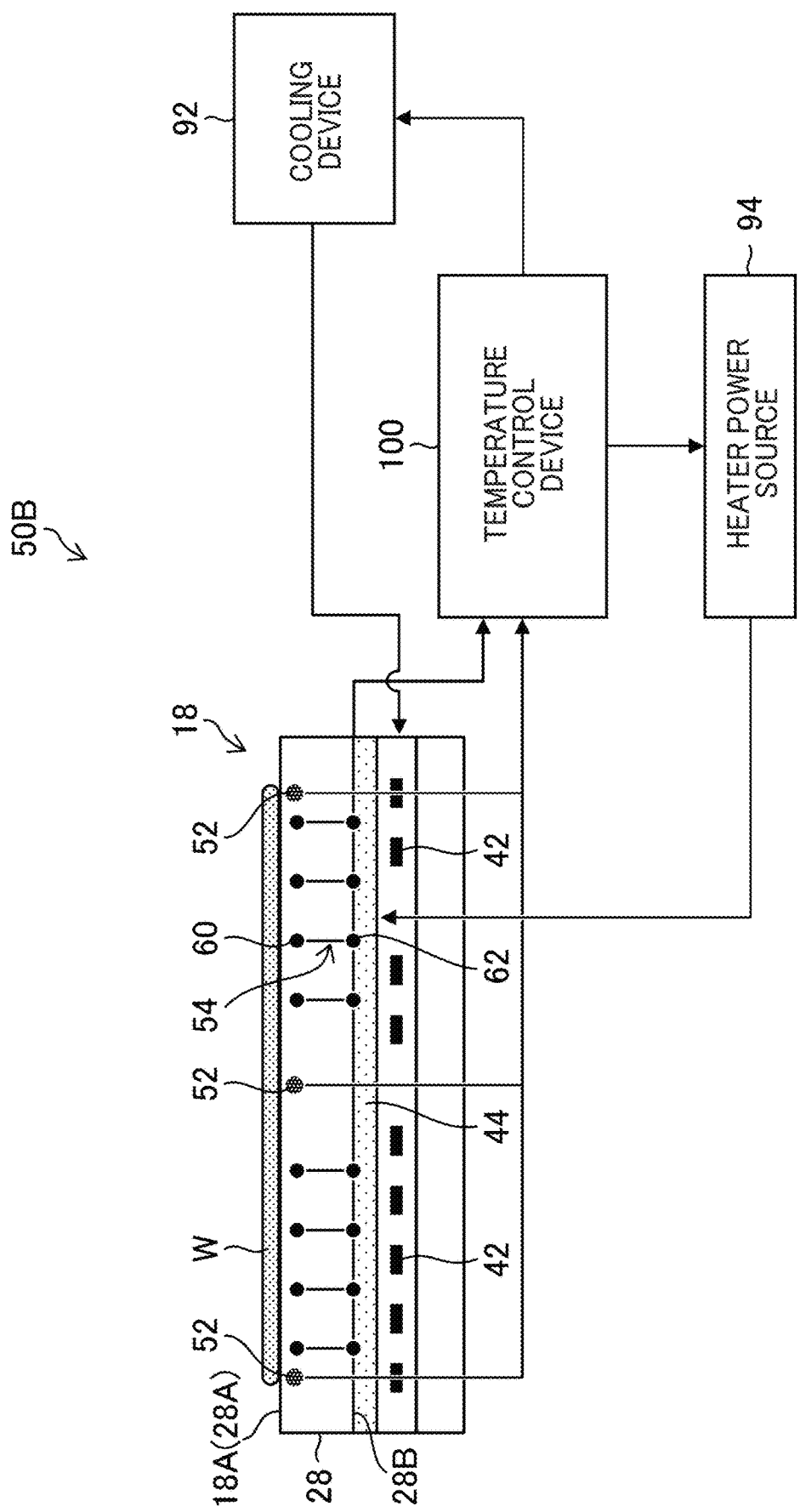
FIG. 9 is a schematic configuration diagram of a temperature control system according to a second modified example.

FIG. 9 is a schematic configuration diagram of a temperature control system 50B according to a second modified example. Note that parts common to those in the first embodiment are assigned the same symbols, and the description thereof is omitted.

As shown in FIG. 9, the temperature control system 50B according to the second modified example is common to that in the first embodiment in that the cooling plates 42 and the heaters 44 are provided in the wafer chuck 18. However, the arrangement form between the cooling plates 42 and the heaters 44 is different from that in the first embodiment. Specifically, the heater 44 is disposed in a state of being in contact with the back side (chuck top back surface 28B) of the chuck top suction plate 28. The cooling plates 42 are disposed on the opposite side of the chuck top suction plate 28, with the heaters 44 intervening therebetween.

Also according to the second modified example, control is achieved with combination of heating by the heaters 44 and cooling by the cooling plates 42, thus allowing temperature control for the wafer chuck 18 in a manner similar to that in the first embodiment.

Second Embodiment

Next, a temperature control system 50 in a second embodiment is described. In the first embodiment described above, based on the detection results of the temperature sensors 52 and the detection result of the heat flow sensor 54, the temperature T at the heat generating part temperature measurement point (the temperature of the wafer chuck 18 corresponding to the heat generating part of the wafer W) is calculated, and temperature control for the wafer chuck 18 is performed based on the calculated temperature T at the heat generating part temperature measurement point. Meanwhile, according to the second embodiment, based on the detection results of the temperature sensors 52, on the detection result of the heat flow sensor 54, and on information about physical property values, dimensions and the like from the heat generating part temperature measurement point to the heat generating part, the device temperature corresponding to the temperature of the heat generating part of the wafer W is calculated, and based on the calculated device temperature, the temperature control for the wafer chuck 18 is performed.

Note that the second embodiment has the basically same configuration as the first embodiment described above except that the control temperature when the temperature control is performed for the wafer chuck 18 is the device temperature. Hereinafter, parts common to those in the first embodiment are assigned the same symbols, and the description thereof is omitted.

Figure 10:
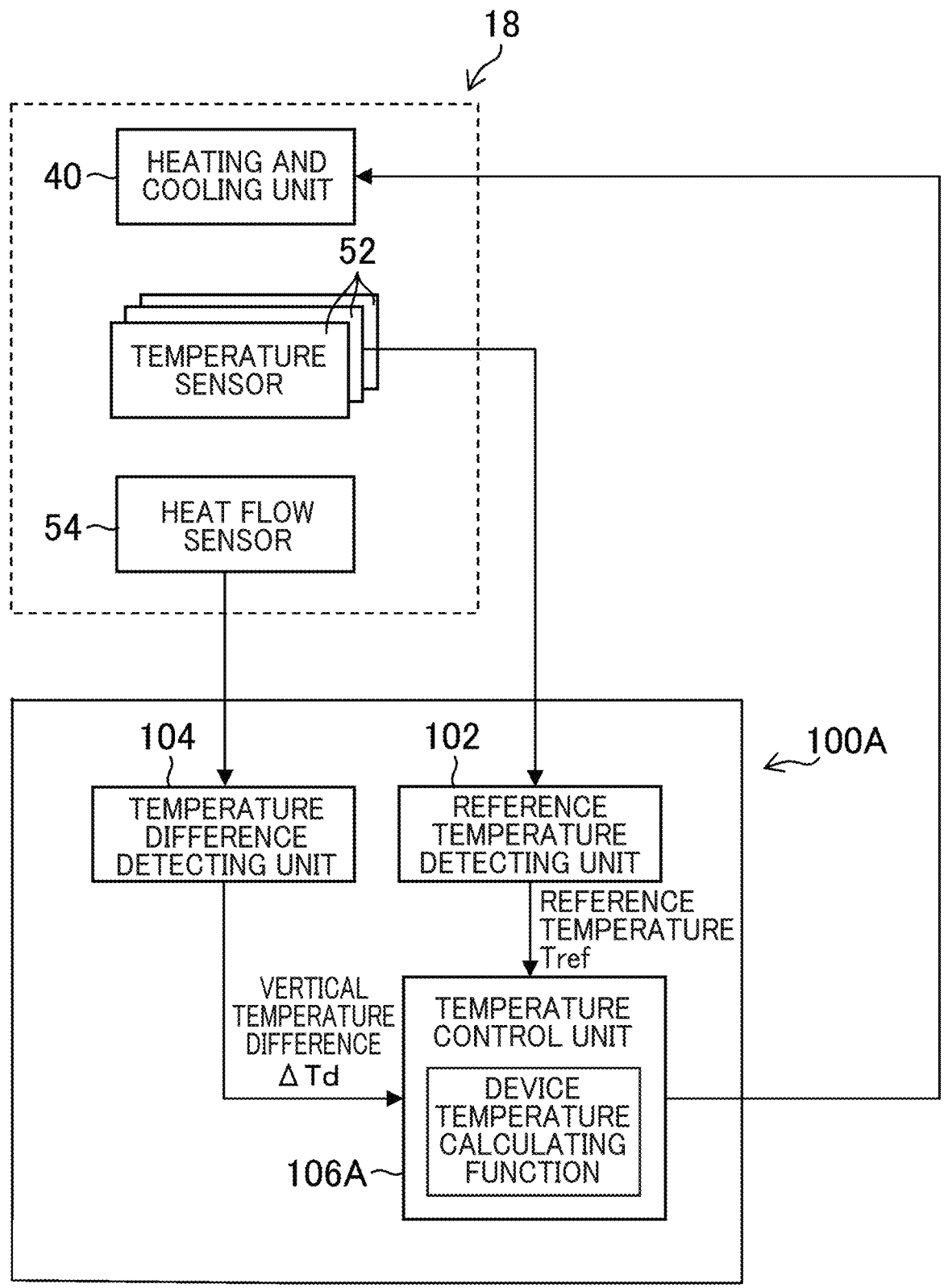
FIG. 10 is a functional block diagram showing the configuration of a temperature control device in a second embodiment.

FIG. 10 is a block diagram of a temperature control device 100A in the second embodiment. As shown in FIG. 10, the temperature control device 100A in the second embodiment includes a temperature control unit 106A that has a device temperature calculating function.

As in the first embodiment described above, the reference temperature Tref detected by the reference temperature detecting unit 102, and the vertical temperature difference ΔTd at the heat generating part temperature measurement point detected by the temperature difference detecting unit 104 are input into the temperature control unit 106A. Information about the physical property values, dimensions and the like from the heat generating part temperature measurement point to the heat generating part (i.e., the wafer chuck 18 and the wafer W) is preliminarily registered, as device temperature calculation condition data for calculating the device temperature, in a memory unit (not shown). The temperature control unit 106A may obtain the device temperature calculation condition data from the memory unit.

The temperature control unit 106A calculates the temperature of the heat generating part of the wafer W (device temperature), based on the reference temperature Tref obtained from the reference temperature detecting unit 102, on the vertical temperature difference ΔTd at the heat generating part temperature measurement point obtained from the temperature difference detecting unit 104, and on the device temperature calculation condition data obtained from the memory unit. The temperature control unit 106A then adopts the device temperature as the control temperature, and executes temperature control (heating and cooling control) for the wafer chuck 18 so that the device temperature may approach the preliminarily set temperature (e.g., a test temperature).

Figure 11:
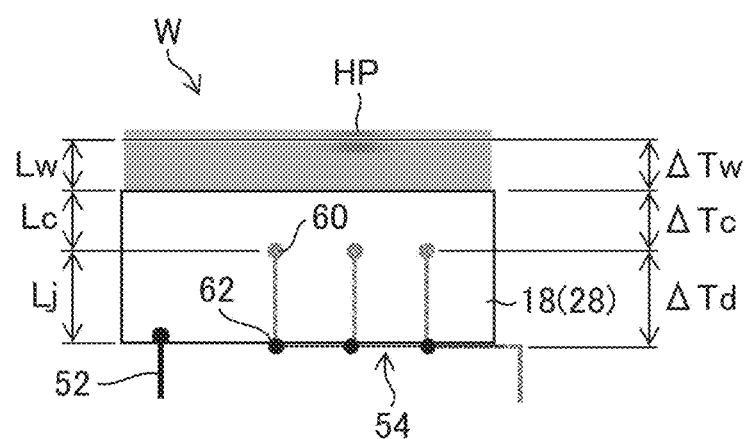
FIG. 11 is an illustration diagram for illustrating a method of calculating a device temperature.

Here, a method of calculating the device temperature performed in the second embodiment is described. FIG. 11 is an illustration diagram for illustrating the method of calculating the device temperature. Here, the thermal conductivity Kw of the wafer W, the thermal conductivity Kj of the material in which the heat flow sensor 54 is embedded, the distance Lc between the temperature measurement points 60 of the heat flow sensor 54 and the holding surface 18A of the wafer chuck 18, the distance Lw between the back of the wafer W and the heat generating part HP and the like are preliminarily registered, as the device temperature calculation condition data, in the memory unit.

As shown in FIG. 11, when it is assumed that the temperature difference between the temperature measurement points 60 of the heat flow sensor 54 and the holding surface 18A of the wafer chuck 18 is ΔTc, the temperature difference between the back of the wafer W and the heat generating part HP is ΔTw, and the temperature of the heat generating part HP of the wafer W is Tw, the device temperature Tw can be obtained as represented by the following Expression (9).

[Formula 9]

$$Tw = Tref + \Delta Td + \Delta Tc + \Delta Tw \qquad \text{Expression (9)}$$

Note that the reference temperature Tref, and the vertical temperature difference ΔTd at the heat generating part temperature measurement point are respectively detected by the reference temperature detecting unit 102 and the temperature difference detecting unit 104 in a manner similar to that in the first embodiment.

When it is assumed that the heat rate at the heat generating part HP is Qd [W], the temperature difference ΔTc between the temperature measurement points 60 of the heat flow sensor 54 and the holding surface 18A of the wafer chuck 18, and the temperature difference ΔTw between the back of the wafer W and the heat generating part HP are respectively obtained by the following Expressions (10) and (11). Here, Sd is the area of the heat generating part HP of the wafer W (area of the heat generating part).

[Formula 10]

$$\Delta Tc = \frac{Qd \cdot Lc}{-Kj \cdot Sd} \qquad \text{Expression (10)}$$

[Formula 11]

$$\Delta Tw = \frac{Qd \cdot Lw}{-Kw \cdot Sd} \qquad \text{Expression (11)}$$

The heat rate Qd at the heat generating part HP may be obtained using the leftmost relational expression in Expression (3) described above. That is, the heat rate Qd at the heat generating part HP may be obtained as represented by the following Expression (12), using the vertical temperature difference ΔTd at the heat generating part temperature measurement point (i.e., the value obtained by converting the temperature difference ΔT obtained from the electromotive force at the heat flow sensor 54 using the area Sd of the heat generating part). Here, Lj is the heat flow distance of the heat flow sensor 54 (the distance between the front side and back side of the heat flow sensor 54).

[Formula 12]

$$Qd = \frac{\Delta Td(-Kj \cdot Sd)}{Lj} \qquad \text{Expression (12)}$$

Consequently, through use of Expressions (9) to (12), the device temperature Tw may be calculated.

(Calculation Example of Device Temperature)

Next, a calculation example of the device temperature Tw is described. Note that the calculation example of the device temperature Tw described here assumes the following conditions as an example.

The reference temperature of the wafer chuck 18: Tref=100[° C.]
The heat flow distance of the heat flow sensor 54: Lj=0.01 [m]
The distance between the temperature measurement points 60 of the heat flow sensor 54 and the holding surface 18A of the wafer chuck 18: Lc=0.005 [m]
The distance between the back surface of the wafer W and the heat generating part HP: Lw=0.0005 [m]
The thermal conductivity of the material in which the heat flow sensor 54 is embedded: Kj=180 [W/mK]
The thermal conductivity of the material of the wafer W: Kw=160 [W/mK]
The area of the heat generating part: Sd=0.000625 [m²]
The temperature difference obtained from the electromotive force V at the heat flow sensor 54: ΔT=8.89[° C.]
The number of temperature measurement points of the heat flow sensor: Ns=114 [points]
The area per pair of thermocouple: Ss=SD÷Ns=0.070875÷114=0.000622 [m²]=S Note that the temperature difference ΔT obtained from the area Sd of the heat generating part and the electromotive force V at the heat flow sensor 54, the number Ns of temperature measurement points of the heat flow sensor 54, and the area Ss per pair of thermocouples are similar to those in the condition in the calculation example described in the first embodiment.

Each temperature difference for calculating the device temperature Tw is calculated as follows. First, similar to the calculation example in the first embodiment, the vertical temperature difference ΔTd at the heat generating part temperature measurement point is 8.847[° C.] as represented by the following Expression (13).

[Formula 13]

$$\Delta Td = \Delta T \frac{S}{Sd} = 8.89 \frac{0.000622}{0.000625} = \qquad \text{Expression (13)}$$

$$8.89 \times 0.9952 = 8.847[°C]$$

The temperature difference ΔTc between the temperature measurement points 60 of the heat flow sensor 54 and the holding surface 18A of the wafer chuck 18 is 4.42[° C.] as represented by the following Expression (14).

[Formula 14]

$$\Delta Tc = \frac{Qd \cdot Lc}{-Kj \cdot Sd} = \frac{-Kj \cdot Sd \cdot \frac{\Delta Td}{Lj} \cdot Lc}{-Kj \cdot Sd} = \Delta Td \frac{Lc}{Lj} = \qquad \text{Expression (14)}$$

$$8.847 \frac{0.005}{0.01} = 4.42[°C]$$

The temperature difference ΔTw between the back of the wafer W and the heat generating part HP is 0.50[° C.] as represented by the following Expression (15).

[Formula 15]

$$\Delta Tw = \frac{Qd \cdot Lw}{-Kw \cdot Sd} = \frac{-Kj \cdot Sd \cdot \frac{\Delta Td}{Lj} \cdot Lw}{-Kw \cdot Sd} = \qquad \text{Expression (15)}$$

$$\Delta Td \frac{Kj}{Kw} \frac{Lw}{Lj} = 8.847 \frac{180}{160} \frac{0.0005}{0.01} = 0.50[°C]$$

Consequently, the device temperature Tw is 113.77[° C.] as represented by the following Expression (16).

[Formula 16]

$$Tw = Tref + \Delta Td + \Delta Tc + \Delta Tw = \qquad \text{Expression (16)}$$

$$100 + 8.85 + 4.42 + 0.50 = 113.77[°C]$$

The temperature control unit 106A in the second embodiment calculates the device temperature Tw according to the method of calculating the device temperature described above. The temperature control unit 106A then adopts the calculated device temperature as the control temperature, and executes temperature control for the wafer chuck 18 so that the device temperature may approach the preliminarily set temperature (e.g., the test temperature).

Consequently, according to the temperature control system 50 in the second embodiment, based on the detection results of the temperature sensors 52, the detection result of the heat flow sensor 54, and the device temperature calculation condition data (information about the physical property values, dimensions and the like from the heat generating part temperature measurement point to the heat generating part), the temperature (device temperature) of the device which is the heat generating part of the wafer W, is calculated, and based on the calculated device temperature, the temperature control for the wafer chuck 18 is performed. Accordingly, the electrical property test of the device to be measured may be highly accurately performed at the desired test temperature.

The temperature control system and the temperature control method according to the present invention have thus been described above in detail. However, it is a matter of course that several improvements or modifications may be applied in a range without departing from the gist of the present invention.

REFERENCE SIGNS LIST

1 ... Wafer test system, 10 ... Prober, 18 ... Wafer chuck, 24 ... Probe card, 25 ... Probe, 28 ... Chuck top suction plate, 34 . . . Thermocouple housing bore, 40 . . . Heating and cooling unit, 42 . . . Cooling plate, 44 . . . Heater, 46 . . . Peltier element, 50, 50A, 50B . . . Temperature control system, 52 . . . Temperature sensor, 54 . . . Heat flow sensor, 56 . . . Thermocouple, 60 . . . Temperature measurement point, 62 . . . Reference junction, 90 . . . Control device, 92 . . . Cooling device, 94 . . . Heater power source, 96 . . . Peltier power source, 100 . . . Temperature control device, 100A . . . Temperature control device, 102 . . . Reference temperature detecting unit, 104 . . . Temperature difference detecting unit, 106 . . . Temperature control unit, 106A . . . Temperature control unit, HP . . . Heat generating part, W . . . Wafer

What is claimed is:

1. A wafer chuck having a holding surface for holding a wafer, the wafer chuck comprising:
  a heating and cooling source configured to heat or cool the wafer chuck;
  at least one temperature sensor disposed in the wafer chuck; and
  a heat flow sensor which is disposed in the wafer chuck, and in which a plurality of thermocouples are connected in series and connecting parts between ones adjacent to each other of the thermocouples are alternately disposed at a first depth position from the holding surface and at a second depth position deeper than the first depth position, wherein
  the temperature sensor is used to measure a reference temperature that is a temperature at the second depth position in a corresponding part being a part corresponding to a heat generating part of the wafer on the wafer chuck,
  the heat flow sensor has a plurality of temperature measurement points provided for the respective thermocouples, the plurality of temperature measurement points being disposed over an entirety of the wafer chuck when the wafer chuck is seen in plan view, and
  the heat flow sensor is used to measure a vertical temperature difference between the first depth position and the second depth position in the corresponding part.

2. The wafer chuck according to claim 1, wherein a plurality of the temperature sensors are disposed in a distributed manner.

3. A temperature control system, comprising:
  the wafer chuck according to claim 1; and
  a temperature control unit configured to calculate a temperature of the corresponding part or the heat generating part as a control temperature, based on a detection result of the temperature sensor and on a detection result of the heat flow sensor.

4. The temperature control system according to claim 3, wherein the temperature control unit executes:
  a process of detecting the reference temperature based on the detection result of the temperature sensor;
  a process of calculating the vertical temperature difference based on the detection result of the heat flow sensor; and
  a process of calculating, as the control temperature, a temperature of the heat generating part temperature measurement point that is a temperature of the corresponding part, based on the reference temperature and the vertical temperature difference.

5. The temperature control system according to claim 3, wherein the temperature control unit executes:
  a process of detecting the reference temperature based on the detection result of the temperature sensor;
  a process of calculating the vertical temperature difference, based on the detection result of the heat flow sensor; and
  a process of calculating, as the control temperature, a device temperature that is a temperature of the heat generating part, based on the reference temperature, on the vertical temperature difference, and on data that includes physical property values and dimensions of the wafer and the wafer chuck.

6. The temperature control system according to claim 4, wherein
  in the wafer chuck, a plurality of the temperature sensors are disposed in a distributed manner, and
  the temperature control unit detects, as the reference temperature, a lowest temperature among temperatures detected by the plurality of temperature sensors, or an average or a median of the temperatures detected by the plurality of temperature sensors.

7. The temperature control system according to claim 3, wherein the temperature control unit controls the heating and cooling source so that the control temperature may be equal to a preset target temperature.

8. A temperature control method of controlling a temperature of the wafer chuck according to claim 1, the method including:
  a reference temperature detecting step of detecting, by the at least one temperature sensor, the reference temperature of the wafer chuck;
  a heat flow detecting step of detecting, by the heat flow sensor, a heat flow caused by partial heat generation of the wafer held on the holding surface; and
  a temperature control step of calculating the vertical temperature difference, based on a detection result of the heat flow detecting step, and calculating a temperature of the corresponding part or the heat generating part as a control temperature, based on the reference temperature detected in the reference temperature detecting step and the vertical temperature difference.

9. The temperature control method according to claim 8, wherein
  the temperature control step includes:
  a process of calculating, as the control temperature, a temperature of a heat generating part temperature measurement point that is a temperature of the corresponding part, based on the reference temperature and the vertical temperature difference.

10. The temperature control method according to claim 8, wherein
  the temperature control step includes:
  a process of calculating, as the control temperature, a device temperature that is a temperature of a heat generating part of the wafer, based on the reference temperature, on the vertical temperature difference, and on data that includes physical property values and dimensions of the wafer and the wafer chuck.

11. The temperature control method according to claim 8, wherein the temperature control step includes a process of heating or cooling the wafer chuck so that the control temperature may be equal to a preset target temperature.

* * * * *